US012794461B2

(12) United States Patent
Ke

(10) Patent No.: US 12,794,461 B2
(45) Date of Patent: Nov. 10, 2026

(54) TRANSMITTER, INTEGRATED CIRCUIT AND METHOD FOR CALIBRATING OUTPUT IMPEDANCE

(71) Applicant: TAIWAN SEMICONDUCTOR MANUFACTURING COMPANY LTD., Hsinchu (TW)

(72) Inventor: Han-Tzung Ke, Hsinchu City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 28 days.

(21) Appl. No.: 19/097,898

(22) Filed: Apr. 2, 2025

(65) Prior Publication Data

US 2026/0312576 A1 Oct. 8, 2026

(51) Int. Cl.

*H03K 5/135* (2006.01)
*G04F 10/00* (2006.01)
*H03K 3/03* (2006.01)

(52) U.S. Cl.

CPC ........... *H03K 5/135* (2013.01); *G04F 10/005* (2013.01); *H03K 3/0315* (2013.01)

(58) Field of Classification Search

CPC ..... H03K 5/135; H03K 3/0315; G04F 10/005
USPC ......... 327/108–112, 141–163, 170, 172–177
See application file for complete search history.

(56) References Cited

U.S. PATENT DOCUMENTS

2009/0267668 A1* 10/2009 Lin ........................ H03K 5/133 327/161

OTHER PUBLICATIONS

Sung-Yong Cho et al., "13.6 A 16Gb 37Gb/s GDDR7 DRAM with PAM3-Optimized TRX Equalization and ZQ Calibration", 2024 IEEE International Solid-State Circuits Conference (ISSCC), Session 13, pp. 242-244, Feb. 20, 2024.

* cited by examiner

*Primary Examiner* — Tomi Skibinski
(74) *Attorney, Agent, or Firm* — WPAT LAW; Anthony King

(57) ABSTRACT

A transmitter is provided. The transmitter includes a driver coupled to a pad, a calibration circuit and a control circuit. The driver includes a pull-up unit having a plurality of first P-type transistors, a pull-down unit having a plurality of first N-type transistors. The calibration circuit includes a ring oscillator configured to provide a first clock signal, a frequency divider configured to divide the first clock signal to provide a second clock signal, and a time to digital converter configured to provide a control signal according to the second clock signal and a reference clock. The control circuit is configured to control the number of the first P-type transistors coupled in parallel between a power supply line and the pad, and the number of the first N-type transistors coupled in parallel between a ground and the pad according to the control signal.

20 Claims, 10 Drawing Sheets

TRANSMITTER, INTEGRATED CIRCUIT AND METHOD FOR CALIBRATING OUTPUT IMPEDANCE

BACKGROUND

Advancements in technology continue to create challenges in designing smaller, faster and more complicated integrated circuits (ICs) having increased functionality. The physical dimensions of transistors are often reduced with each new generation of various integrated circuits. Some integrated circuits interface with external components (or ICs) that operate at different voltages than the IC, or have an effect on the integrated circuit that affects the performance of the IC. For the high-speed and low-voltage ICs, input/output (I/O) interfaces are important for the performance of the IC.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the sizes of the various features may be arbitrarily increased or decreased for clarity of discussion.

DETAILED DESCRIPTION

Figure 1:
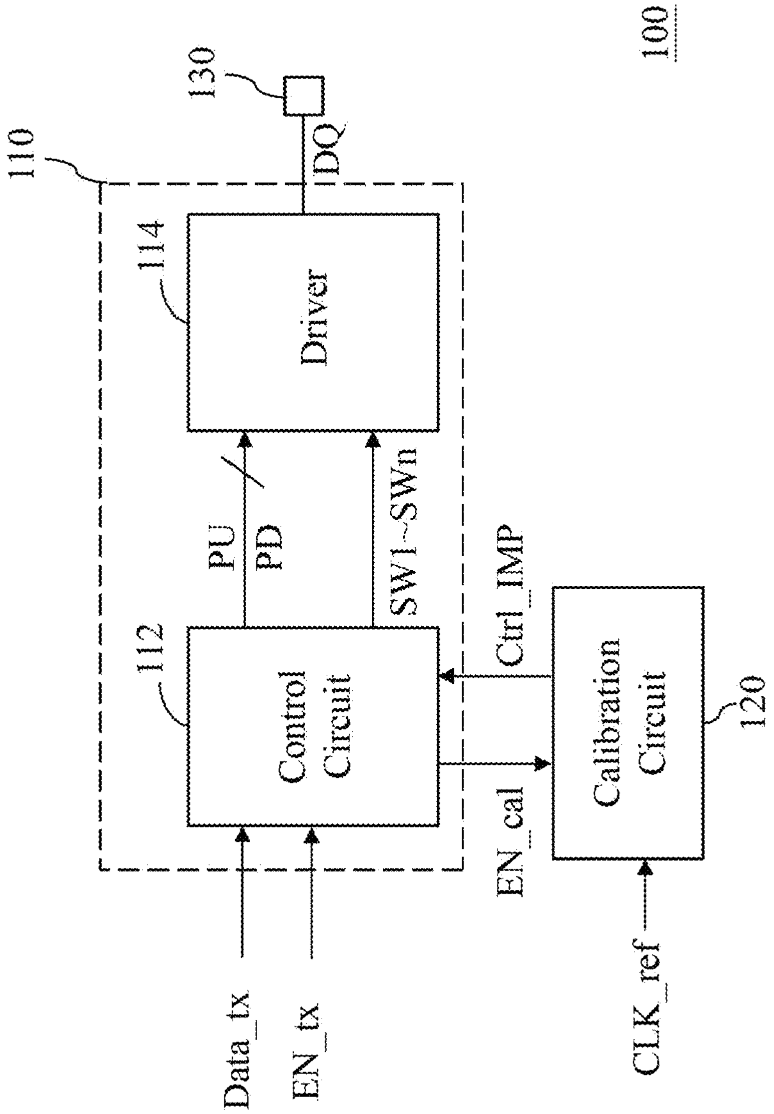
FIG. 1 is a circuit diagram of a transmitter in an integrated circuit (IC), in accordance with some embodiments of the present disclosure.

The following disclosure provides many different embodiments, or examples, for implementing different features of the provided subject matter. Specific examples of components and arrangements are described to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

While embodiments of the present disclosure are discussed in detail, it should be appreciated that the present disclosure provides many applicable inventive concepts that can be embodied in a wide variety of specific contexts. The specific embodiments discussed are merely illustrative and do not limit the scope of the disclosure.

Further, spatially relative terms, such as "beneath", "below", "above", "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

According to the embodiments, a transmitter and a method for calibrating output impedance are provided. A ring oscillator is used to generate a first clock signal, and the first clock signal is divided to generate a second clock signal. A time interval of the second clock signal is converted to a digital code according to a reference clock. The output impedance of a driver is maintained according to the digital code. By performing the calibration operation according to the embodiments, the precise output impedance matching of the transmitter is implemented in an integrated circuit (IC), thereby achieving very low reflection effects for high speed interface. Furthermore, no external precision resistor is used to calibrate the output impedance of transmitter, thereby cost (e.g., Bom and IC cost) is decreased. Moreover, in addition to initiating the calibration operation at startup of the IC, the calibration operation is performed dynamically to maintain a constant output impedance withstand variations in process, voltage and temp (PVT) when the driver is idle, thereby making the output impedance more precise.

FIG. 1 is a circuit diagram of a transmitter 100 in an integrated circuit (IC), in accordance with some embodiments of the present disclosure. The transmitter 100 is configured to provide an output signal DQ to a pad 130 according to the signal (or data) Data_tx to be transmitted to a specific device (not shown) through the pad 130. In some embodiments, the specific device is a low-voltage and high-speed device. In some embodiments, the transmitter 100 is implemented as an output path in an input/output (I/O) circuit of the IC. In some embodiments, the IC and the specific device are implemented in different package devices. In some embodiments, the IC and the specific device are implemented in the same package device. In some embodiments, the IC is a master device and the specific device is a slave device. For example, the specific device is a memory and the IC is a controller for the memory. In some embodiments, the pad 130 is a bi-directional pad with the output path in an output mode and the input path in an input mode. To simplify the explanation, the circuits in the input path of the pad 130 are omitted.

In FIG. 1, the transmitter 100 includes a driving circuit 110 and a calibration circuit 120. The driving circuit 110 includes a control circuit 112 and a driver 114. The control circuit 112 is configured to provide the enable signal EN_cal to the calibration circuit 120. In response to the enable signal EN_cal, the calibration circuit 120 is configured to perform a calibration operation and then provide the control signal Ctrl_IMP to the control circuit 112, so as to control an output impedance of the driver 114, i.e., the output impedance at the pad 130. The control circuit 112 is configured to provide the signals PU and PD to the driver 114 according to the signal Data_tx and the enable signal EN_tx. Furthermore, the control circuit 112 is configured to provide the control signals SW1 through SWn to the driver 114 according to the control signal Ctrl_IMP from the calibration circuit 120. In some embodiments, the control signal Ctrl_IMP or the control signals SW1 through SWn are further provided to other drivers (not shown) of the IC for controlling the output impedance of each driver, which is coupled to an individual pad.

Figure 2:
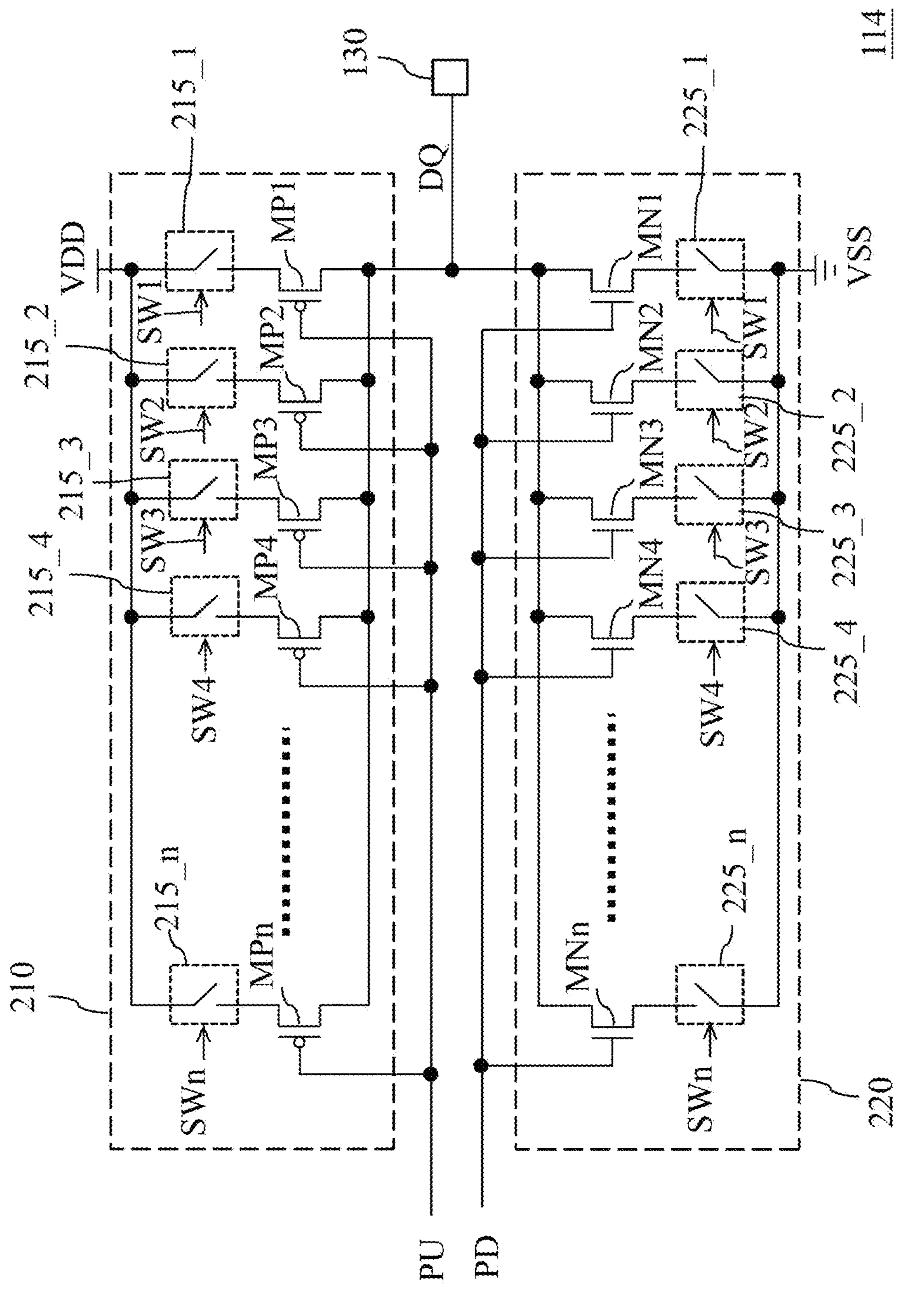
FIG. 2 is a circuit diagram of the driver of FIG. 1, in accordance with some embodiments of the present disclosure.

FIG. 2 is a circuit diagram of the driver 114 of FIG. 1, in accordance with some embodiments of the present disclosure. The driver 114 includes a pull-up unit 210 and a pull-down unit 220.

The pull-up unit 210 includes the transistors MP1 through MPn. The transistors MP1 through MPn are P-type transistors with different sizes. The sizes (or channel sizes) of transistors MP1 to MPn increase proportionally. For example, the size of transistor MP2 is twice that of transistor MP1, the size of transistor MP3 is twice that of transistor MP2, and so on. In this embodiment, the size of transistor MPn is 2N times the size of transistor MP1. The drains of transistors MP1 through MPn are coupled to the pad 13. The sources of transistors MP1 through MPn are coupled to a power supply line VDD through the switches 215_*a* through 215_*n*, respectively, and the switches 215_*a* through 215_*n* are controlled by the control signals SW1 through SWn, respectively. For example, the source of transistor MP1 is coupled to the power supply line VDD through the switch 215_1, and the switch 215_1 is controlled by the control signal SW1. Furthermore, the source of transistor MP2 is coupled to the power supply line VDD through the switch 215_2, and the switch 215_2 is controlled by the control signal SW2.

The gates of transistors MP1 through MPn are coupled together to receive the signal PU from the control circuit 112. When the enable signal EN-tx is disabled, the transmitter 100 is configured to stop providing the output signal DQ to the pad 130. Therefore, the control circuit 112 is configured to provide the signal PU with a high voltage level (or high logic level) to turn off the transistors MP1 through MPn. Conversely, when the enable signal EN-tx is enabled, the transmitter 100 is configured to provide the output signal DQ corresponding to the signal Data_tx to the pad 130. In some embodiments, in response to the signal Data_tx with a low voltage level (or low logic level), the control circuit 112 is configured to provide the signal PU with a high voltage level (or high logic level) to turn off the transistors MP1 through MPn. In response to the signal Data_tx with a high voltage level (or low logic level), the control circuit 112 is configured to provide the signal PU with a low voltage level (or low logic level) to turn on the transistors MP1 through MPn, thus the output signal DQ having a high voltage level is provided to the pad 130. When the connected switch is turned on by the corresponding control signal, the switch and the transistor will form a conductive path between the power supply line VDD and the pad 130. For example, when the switches 215_1 and 215_3 are turned on, the turned-on transistor MP1 and the turned-on switch 215_1 form a first conductive path between the power supply line VDD and the pad 130, and the turned-on transistor MP3 and the turned-on switch 215_3 form a second conductive path between the power supply line VDD and the pad 130. Therefore, when one or more of the transistors MP1 through MPn are turned on in the pull-up unit 210, the output impedance of the driver 114 is determined according to the equivalent impedances of the conductive paths in the pull-up unit 210. In the pull-up unit 210, by controlling the number of transistors MP1 through MPn coupled in parallel, a desired output impedance (e.g., 50 ohms) is obtained for the transmitter 100.

The pull-down unit 220 includes the transistors MN1 through MNn. The transistors MN1 through MNn are N-type transistors with different sizes. The sizes (or channel sizes) of transistors MN1 to MNn increase proportionally. For example, the size of transistor MN2 is twice that of transistor MN1, the size of transistor MN3 is twice that of transistor MN2, and so on. In this embodiment, the size of transistor MNn is 2N times the size of transistor MN1. The drains of transistors MN1 through MNn are coupled to the pad 13. The sources of transistors MN1 through MNn are coupled to a ground VSS through the switches 225_*a* through 225_*n*, respectively, and the switches 225_*a* through 225_*n* are controlled by the control signals SW1 through SWn, respectively. For example, the source of transistor MN3 is coupled to the ground VSS through the switch 225_3, and the switch 225_3 is controlled by the control signal SW3. Furthermore, the source of transistor MN4 is coupled to the ground VSS through the switch 225_4, and the switch 225_4 is controlled by the control signal SW4.

The gates of transistors MN1 through MNn are coupled together to receive the signal PD from the control circuit 112. When the enable signal EN-tx is disabled, the transmitter 100 is configured to stop providing the output signal DQ to the pad 130. Therefore, the control circuit 112 is configured to provide the signal PD with a low voltage level (or low logic level) to turn off the transistors MN1 through MNn. Conversely, when the enable signal EN-tx is enabled, the transmitter 100 is configured to provide the output signal DQ corresponding to the signal Data_tx to the pad 130. In some embodiments, in response to the signal Data_tx with a high voltage level (or high logic level), the control circuit 112 is configured to provide the signal PD with a low voltage level (or low logic level) to turn off the transistors MN1 through MNn. In response to the signal Data_tx with a low voltage level (or low logic level), the control circuit 112 is configured to provide the signal PD with a high voltage level (or high logic level) to turn on the transistors MN1 through MNn, thus the output signal DQ having a low voltage level is provided to the pad 130. When the connected switch is turned on by the corresponding control signal, the switch and the transistor will form a conductive path between the ground VSS and the pad 130. For example, when the switches 225_1 and 225_3 are turned on, the turned-on transistor MN1 and the turned-on switch 225_1 form a first conductive path between the ground VSS and the pad 130, and the turned-on transistor MN3 and the turned-on switch 225_3 form a second conductive path between the ground VSS and the pad 130. Therefore, when one or more of the transistors MN1 through MNn are turned on in the pull-down unit 220, the output impedance of the driver 114 is determined according to the equivalent impedances of the conductive paths in the pull-down unit 220. In the pull-down unit 220, by controlling the number of transistors MN1 through MNn coupled in parallel, a desired output impedance (e.g., 50 ohms) is obtained for the transmitter 100.

In the embodiment of FIG. 2, the number of transistors MP1 through MPn in the pull-up unit 210 is equal to the number of transistors MN1 through MNn in the pull-down unit 220. Each of the control signals SW1 through SWn is configured to control the corresponding switches in the pull-up unit 210 and the pull-down unit 220. In other words, the number of transistors MN1 through MNn coupled in parallel in the pull-down unit 220 is equal to the number of transistors MP1 through MPn coupled in parallel by the control signals SW1 through SWn in the pull-up unit 210. Furthermore, the output impedance provided by the pull-up unit 210 is equal to the output impedance provided by the pull-down unit 220. In other words, an equivalent impedance between the power supply line VDD and the pad 130 through the transistors MP1 through MPn coupled in parallel is equal to an equivalent impedance between the ground VSS and the pad 130 through the transistors MN1 through MNn coupled in parallel.

Figure 3:
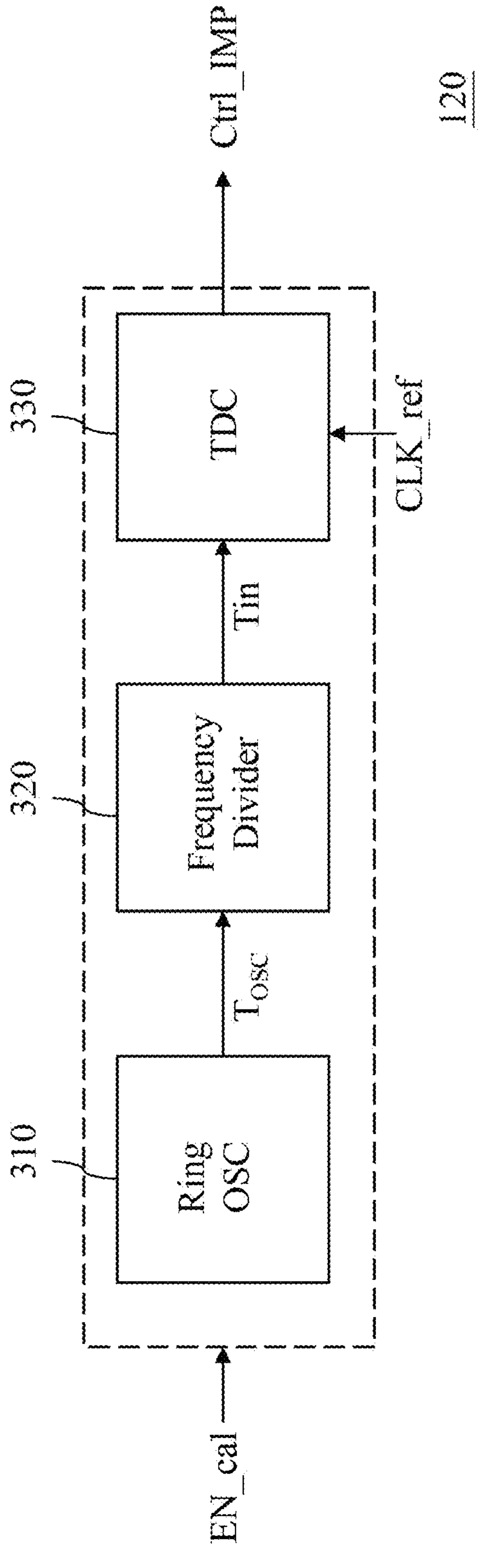
FIG. 3 is a circuit diagram of the calibration circuit of FIG. 1, in accordance with some embodiments of the present disclosure.

FIG. 3 is a circuit diagram of the calibration circuit 120 of FIG. 1, in accordance with some embodiments of the present disclosure. The calibration circuit 120 includes a ring oscillator (OSC) 310, a frequency divider 320, and a time to digital converter (TDC) 330. When the calibration circuit 120 is enabled by the enable signal EN_cal from the control circuit 112 of FIG. 1, the ring OSC 310 is configured to provide a clock signal $T_{OSC}$ to the frequency divider 320. In response to the enable signal EN_cal, the frequency divider 320 is configured to divide the clock signal $T_{OSC}$ by an integer value to generate a clock signal Tin. In some embodiments, the integer value is a multiple of 2. In some embodiments, the integer value is assigned by the enable signal EN_cal. The TDC 330 is configured to provide the control signal Ctrl_IMP to the control circuit 112 according to the clock signal Tin and a reference clock CLK_ref, so as to control an output impedance of the driver 114. In some embodiments, the TDC 330 is used to measure a specific time interval of the clock signal Tin according to the reference clock CLK_ref and provide a digital code of the control signal Ctrl_IMP representation of the specific time interval. In should be noted that the reference clock CLK_ref has a higher frequency and is therefore faster than the clock signal Tin.

Figure 4:
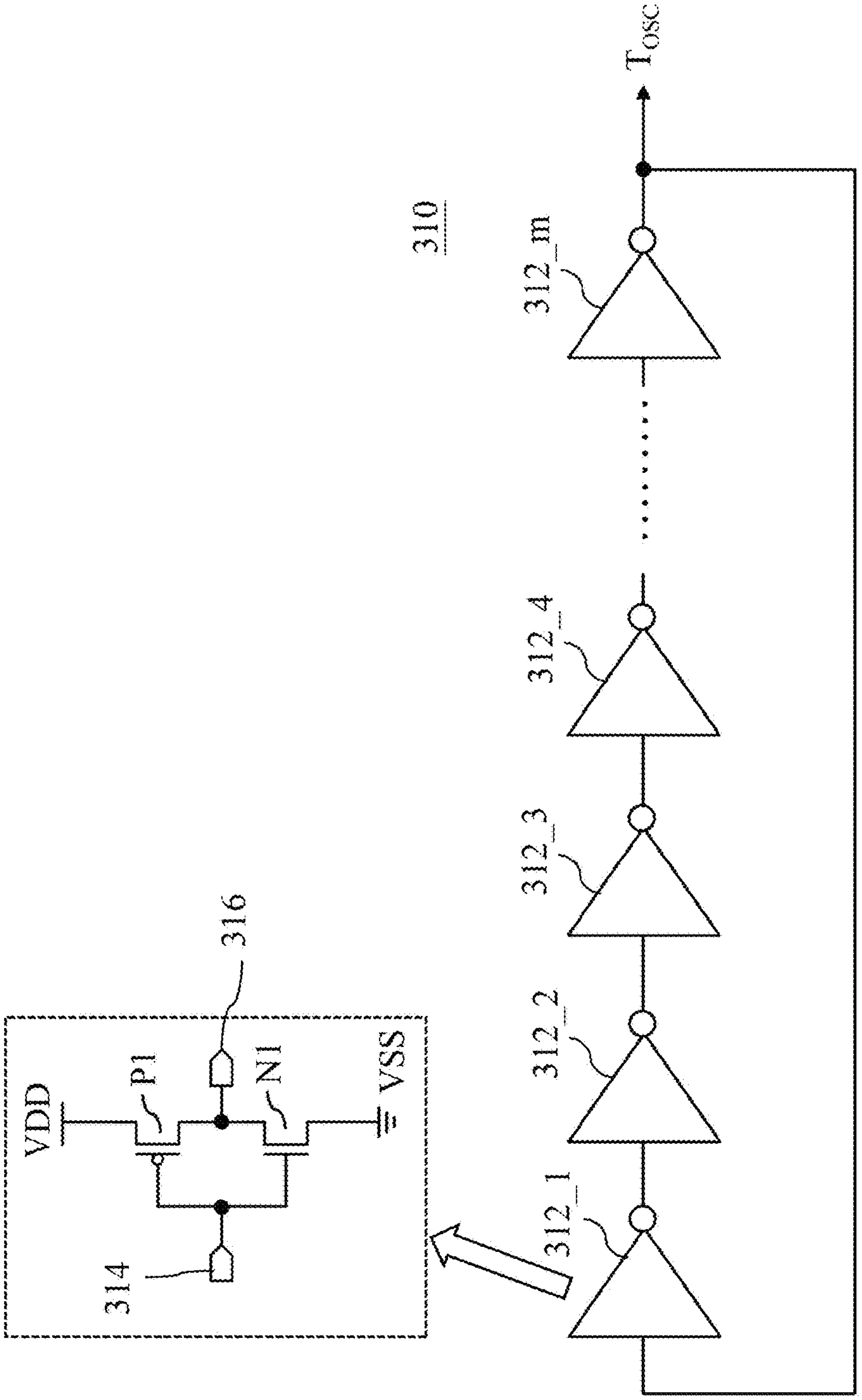
FIG. 4 is a circuit diagram of the Ring oscillator (OSC) of FIG. 3, in accordance with some embodiments of the present disclosure.

FIG. 4 is a circuit diagram of the Ring OSC 310 of FIG. 3, in accordance with some embodiments of the present disclosure. The Ring OSC 310 includes the inverters 312_1 through **312_*m* connected in a chain. The number of inverters 312_1 through 312_*m* is odd, and the inverters 312_1 through 312_*m* are connected in a ring. For example, the inverter 312_1 is a first inverter in the chain and the inverter 312_*m* is the last inverter in the chain. Furthermore, the clock signal $T_{OSC}$ generated in the output terminal of the inverter 312_*m* is fed back into the input terminal of the inverter 312_1. The inverters 312_1 through 312_*m* have the same circuit configuration and the same drive capability. For example, each of the inverters 312_1 through 312_*m* includes a P-type transistor P1 and an N-type transistor N1. The P-type transistor P1 is coupled between a power supply line VDD and an output terminal 316, and the N-type transistor N1 is coupled between a ground VSS and the output terminal 316. The gates of the P-type transistor P1 and the N-type transistor N1 are coupled to the input terminal 314. It should be noted that the size of P-type transistor P1 is half that of transistor MPn in the pull-up unit 210 of FIG. 2. Similarly, the size of N-type transistor N1 is half that of transistor MNn in the pull-down unit of FIG. 2**.

Figure 5:
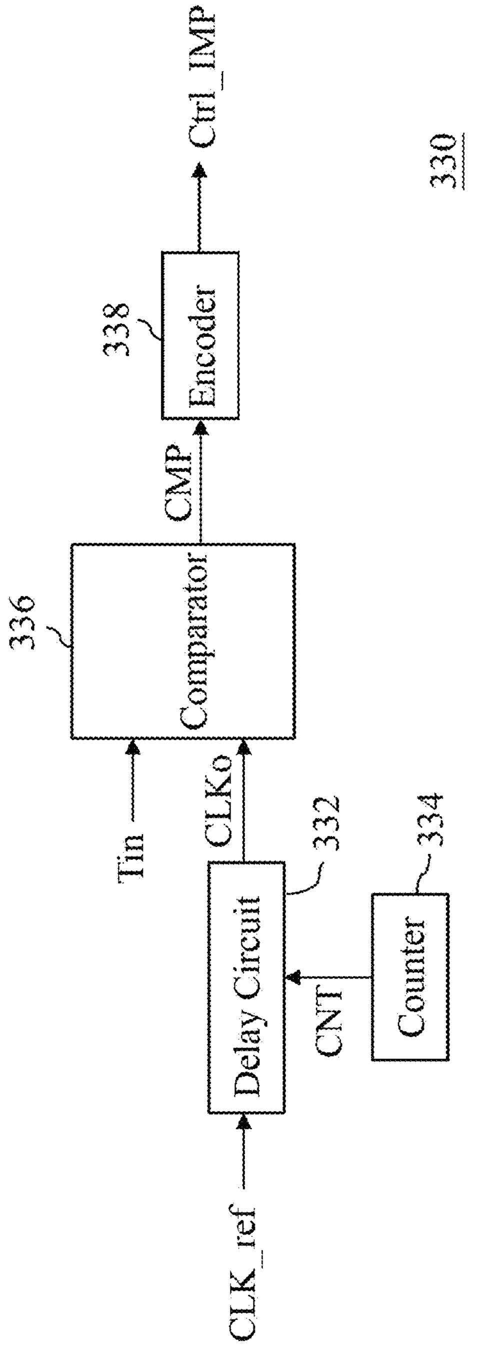
FIG. 5 is a circuit diagram of the time to digital converter (TDC) of FIG. 3, in accordance with some embodiments of the present disclosure.

FIG. 5 is a circuit diagram of the TDC 330 of FIG. 3, in accordance with some embodiments of the present disclosure. The TDC 330 includes a delay circuit 332, a counter 334, a comparator 336 and an encoder 338. The delay circuit 332 is configured to delay the reference clock CLK_ref according to a signal CNT from the counter 334, so as to provide the signal CLKo (i.e., the delayed reference clock CLK_ref) to the comparator 336. In some embodiments, the falling edge of the reference clock CLK_ref is delayed by the delay circuit 332 to generate the signal CLKo, and the delay time of the falling edge is determined according to the signal CNT. In some embodiments, the delay circuit 332 includes a delay line (DL). In some embodiments, the delay circuit 332 can be any known circuit that can be used to delay the reference clock CLK_ref. The comparator 336 is configured to compare the clock signal Tin and the signal CLKo and then provide a signal CMP with one bit to indicate whether the clock signal Tin is equal to the signal CLKo. The encoder 338 is configured to convert the signal CMP into the control signal Ctrl_IMP with a multi-bit binary code. In some embodiments, the bit number of the control signal Ctrl_IMP is equal to N, i.e., the number of transistors in each of the pull-up unit 210 and the pull-down unit 220 in FIG. 2. In some embodiments, each bit of the control signal Ctrl_IMP corresponds to an individual switch in the pull-up unit 210 and the pull-down unit 220.

Figure 6:
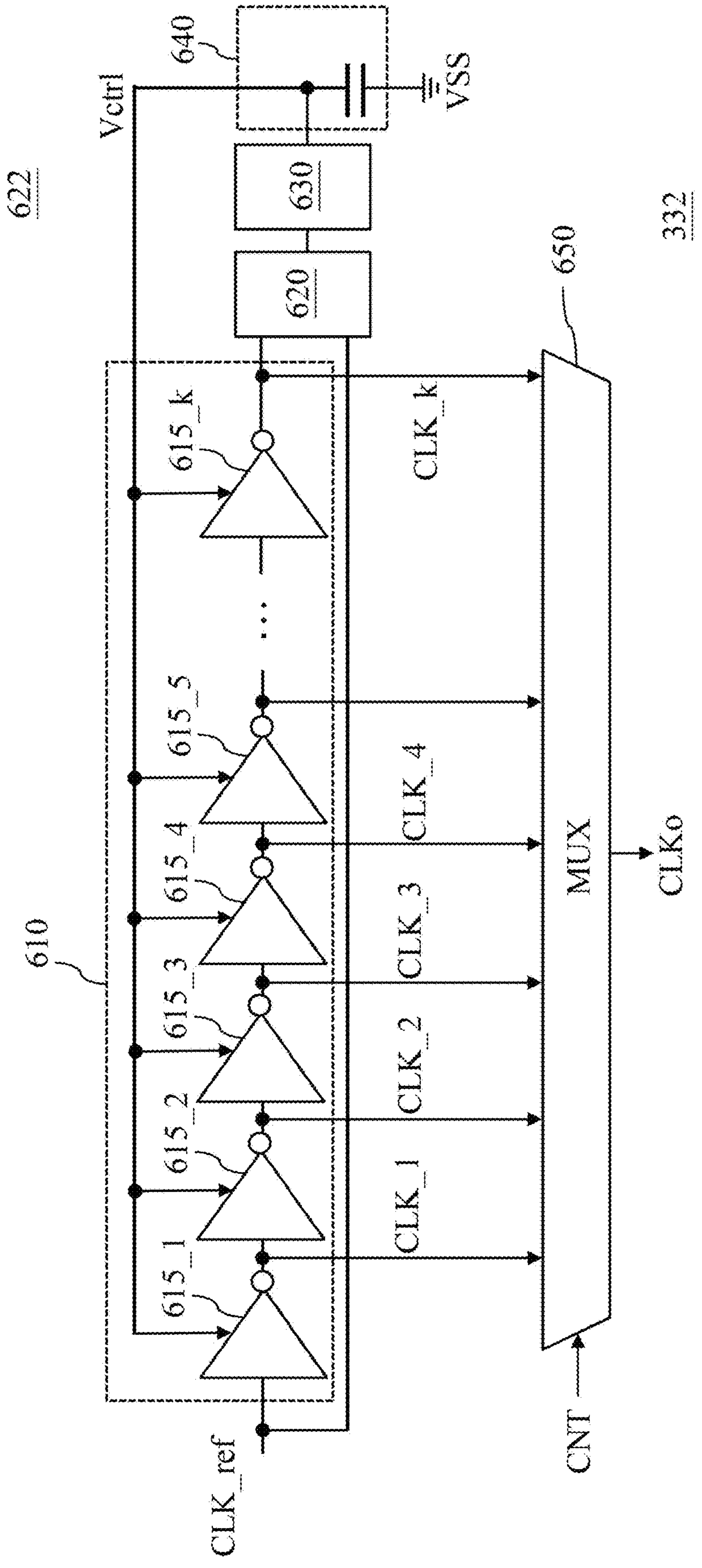
FIG. 6 is a circuit diagram of the delay circuit of FIG. 5, in accordance with some embodiments of the present disclosure.

FIG. 6 is a circuit diagram of the delay circuit 332 of FIG. 5, in accordance with some embodiments of the present disclosure. The delay circuit 332 includes a voltage-controlled delay line 610, a phase detector (PD) 620, a charge pump (CP) 630, a loop filter 640, and a multiplexer (MUX) 650. The voltage-controlled delay line 610 includes the inverters 615_1 through **615_*k* connected in a chain. Each of the inverters 615_1 through 615_*k* is configured to provide a clock to the MUX 650. For example, the inverter 615_1 is configured to delay the reference clock CLK_ref to generate the clock CLK_1 to the MUX 650 and the inverter 615_2. Similarly, the inverter 615_2 is configured to delay the clock CLK_1 to generate the clock CLK_2 to the MUX 650 and the inverter 615_3, and so on. The phase detector 620 is configured to detect a phase between the clock CLK_k and the reference clock CLK_ref. According to the phase detected by the phase detector 620, the charge pump 630 is configured to provide a control signal Vctrl to control the delay time of the inverters 615_1 through 615_*k* in the voltage-controlled delay line 610 through the loop filter 640. In some embodiments, if the time delay is different from integer multiples of clock periods, the closed loop in the delay circuit 332 automatically correct it by changing the delay time of the voltage-controlled delay line 610 through the control signal Vctrl. Furthermore, the MUX 650 is configured to selectively provide the clocks CLK_1 through CLK_k as the clock CLKo based on the signal CNT from the counter 334 of FIG. 5. In some embodiments, the counter 334 is configured to provide the signal CNT with the count value to the MUX 650 sequentially, so that the MUX 650 is configured to sequentially output the clocks CLK_1 through CLK_k as the clock CLKo. In some embodiments, the counter 334 is configured to count sequentially from 1** to k.

In some embodiments, the counter 334 is configured to count from 1 to a specific value, and the specific value is less than k. In some embodiments, the specific value is assigned by the enable signal EN_cal from the control circuit 112 of FIG. 1.

Figure 7:
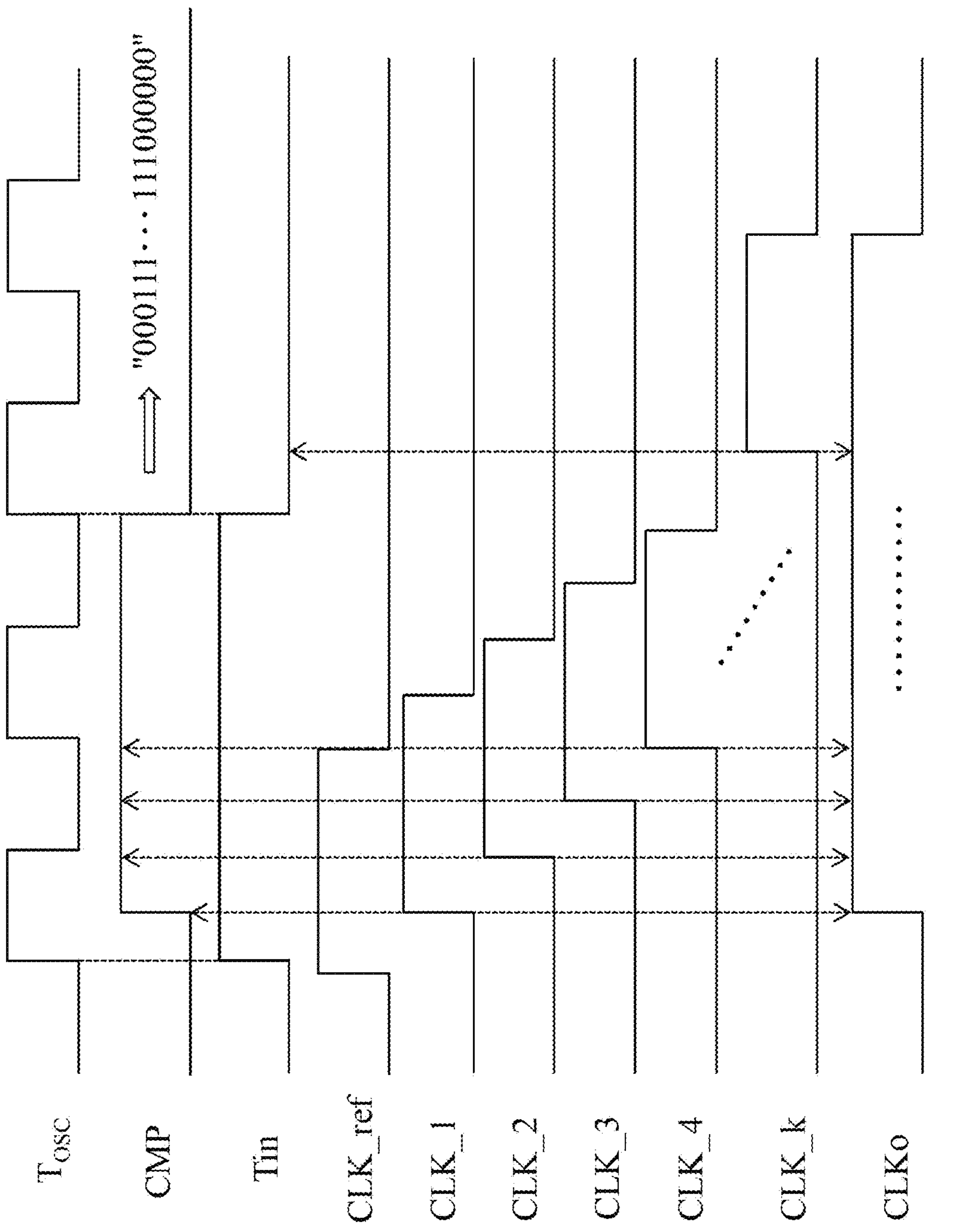
FIG. 7 is a waveform of the signals of the TDC and delay circuit, in accordance with some embodiments of the present disclosure.

FIG. 7 is a waveform of the signals of the TDC 330 and delay circuit 332, in accordance with some embodiments of the present disclosure. In the embodiment of FIG. 7, the clock signal Tin is generated by divide the clock signal $T_{OSC}$ from the ring OSC 310 by 4 through the frequency divider 320. Since the clock signal $T_{OSC}$ is generated by the ring OSC 310 itself, the clock signal Tin needs to be synchronized with the clock signal (i.e., the reference clock CLK_ref) of the IC for subsequent operations. In some embodiments, the reference clock CLK_ref of the IC is generated based on a crystal oscillator connected to the IC. According to the reference clock CLK_ref, the delay circuit 332 is configured to extend the period of the reference clock CLK_ref to obtain the clock CLKo according to the clocks CLK_1 through CLK_k. After comparing the clock CLKo and the clock signal Tin, a sequence of values "000111 . . . 11100000" is obtained from the signal CMP, where "1" represents that both the clock signal Tin and the clock CLKo are at a high voltage level (or high logic level), and "0" represents that either the clock signal Tin or the clock CLKo is at a low voltage level (or low logic level). As shown in FIG. 7, the reference clock CLK_ref has a higher frequency and is therefore faster than the clock signal Tin.

Referring back to FIG. 5, the sequence of values "000111 . . . 11100000" is obtained by the encoder 338. In some embodiments, the encoder 338 is a thermometer to binary (T2B) converter. The encoder 338 is configured to convert the sequence of values "000111 . . . 11100000" to the control signal Ctrl_IMP with L-bit binary codes, where L is an integer. In some embodiments, the integer L is equal to N, i.e., the number of all transistors in each of the pull-up unit 210 and the pull-down unit 220 of FIG. 2. In some embodiments, each bit of the control signal Ctrl_IMP corresponds to a separate one of the control signals SW1 through SW. For example, assuming that the integer L is 5 and the sequence of values is "0001111111100", which contains seven consecutive 1's, the encoder is configured to convert the sequence of values "0001111111000" into the binary value "00111" of the control signal Ctrl_IMP. In this example, the least significant bit (LSB) to the most significant bit (MSB) of the control signal Ctrl_IMP correspond to the control signals SW1 to SW5, respectively. Therefore, in response to the binary value "00111" of the control signal Ctrl_IMP, the control circuit 112 is configured to provide the control signals SW1 through SW3 with a first logic level to turn on the switches 215_1 through 215_3 and the switches 225_1 through 225_3 of FIG. 2. Furthermore, the control circuit 112 is configured to provide the control signals SW4 and SW5 with a second logic level to turn off the switches 215_4 and 215_5 and the switches 225_4 and 225_5 of FIG. 2.

In some embodiments, the comparator 336, the delay circuit 332 and the counter 334 are replaced by a sampling circuit. The sampling circuit is configured to use a sampling clock to sample the clock signal Tin to generate the signal CMP, and the frequency of the sampling clock is greater than the reference clock CLK_ref.

Figure 8:
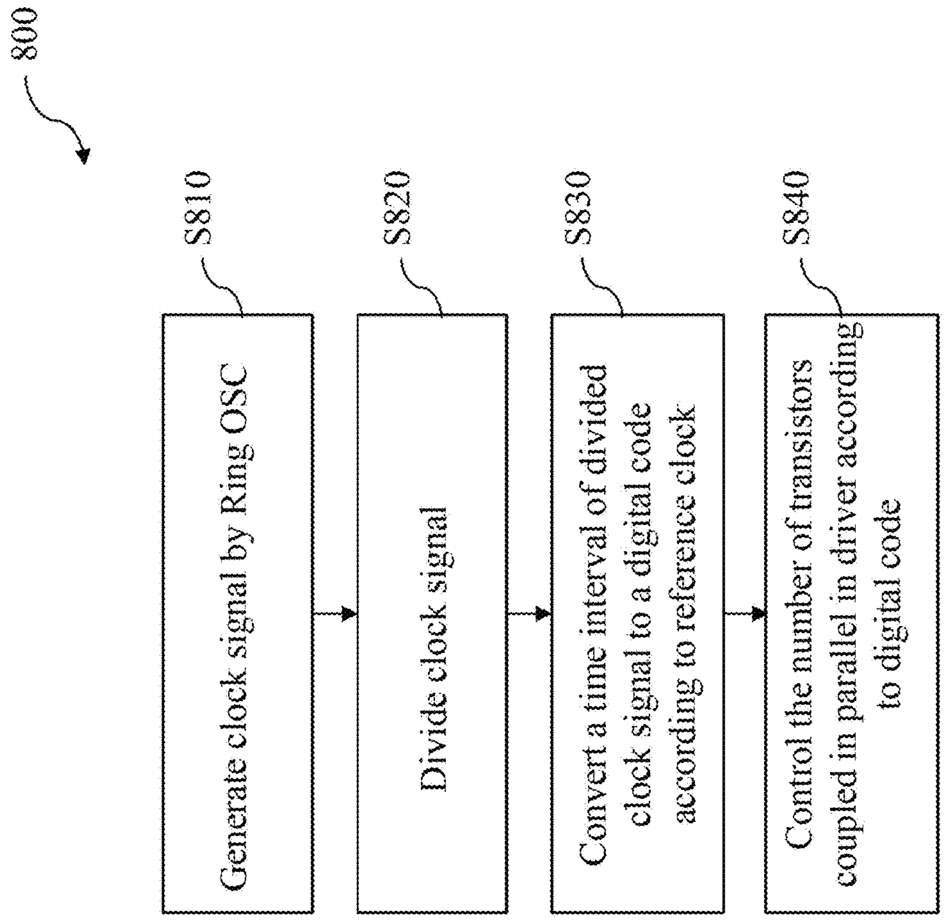
FIG. 8 is a method for calibrating output impedance of a driver of a transmitter, in accordance with some embodiments of the present disclosure.

FIG. 8 is a method 800 for calibrating output impedance of a driver of a transmitter, in accordance with some embodiments of the present disclosure. The method 800 is performed to maintain a constant output impedance withstand variations in process, voltage and temp (PVT). In operation S810, a ring OSC 310 is used to generate a clock signal $T_{OSC}$. As shown in FIG. 4, an odd number of inverters 312_1 through 312_*m* are connected in a ring to generate the clock signal $T_{OSC}$. In some embodiments, the inverters 312_1 through 312_*m* have the same circuit configuration and the same drive capability. In operation S820, a frequency divider 320 is used to divide the clock signal $T_{OSC}$ by an integer value to generate a clock signal Tin (also called the divided clock signal $T_{OSC}$). In some embodiments, the integer value is a multiple of 2. In operation S830, a TDC 330 is used to convert a specific time interval of the divided clock signal $T_{OSC}$ to the control signal Ctrl_IMP according to a reference clock CLK_ref. The control signal Ctrl_IMP is a digital signal with a multi-bit binary code. In operation S840, the number of transistors coupled in parallel in the pull-up unit 210 and the number of transistors coupled in parallel in the pull-down unit 220 are controlled according to the control signal Ctrl_IMP, so as to maintain a constant output impedance in an output pad of the transmitter.

In semiconductor manufacturing, a process corner is an example of a design-of-experiments (DoE) technique that refers to a variation of design (process) parameters used to realize an IC design onto a semiconductor wafer/substrate. Process corners represent the extremes of these parameter variations within which a circuit that has been etched onto the wafer can still function correctly. For example, each transistor may include three lumped corners: a typical corner, a fast corner, and a slow corner, which represent a typical speed of an electrical property (e.g., a carrier mobility), a fast speed of the electrical property, and a slow speed of the electrical property, respectively. Accordingly, a total of five corners may be used to describe global variations of a sub-circuit of the die: a typical-typical (TT) corner (representing a typical speed of an N-type carrier mobility and a typical speed of a P-type carrier mobility), a fast-fast (FF) corner (representing a fast speed of the N-type carrier mobility and a fast speed of the P-type carrier mobility), a slow-slow (SS) corner (representing a slow speed of the N-type carrier mobility and a slow speed of the P-type carrier mobility), a fast-slow (FS) corner (representing a fast speed of the N-type carrier mobility and a slow speed of the P-type carrier mobility), and a slow-fast (SF) corner (representing a slow speed of the N-type carrier mobility and a fast speed of the P-type carrier mobility).

Figure 9:
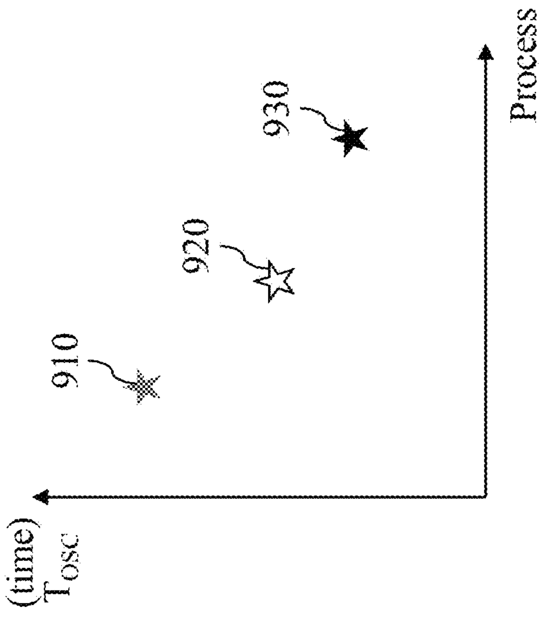
FIG. 9 shows a schematic diagram illustrating the period of clock signal $T_{OSC}$ at various process corners, in accordance with some embodiments of the present disclosure.

FIG. 9 shows a schematic diagram illustrating the period of clock signal $T_{OSC}$ at various process corners, in accordance with some embodiments of the present disclosure. The clock signal $T_{OSC}$ has the slowest frequency at the SS corner and the fastest frequency at the FF corner. The inverse of frequency is called the period. Thus, the clock signal $T_{OSC}$ has the longest period (i.e., the longest time) at the SS corner, labeled as 910, and the clock signal $T_{OSC}$ has the shortest period (i.e., the shortest time) at the FF corner, labeled as 930. Furthermore, the period of the clock signal $T_{OSC}$ at the TT corner is labeled as 920. As shown in FIG. 9, the period of the clock signal $T_{OSC}$ generated by the ring OSC 310 will be affected by different process corners.

Figure 10:
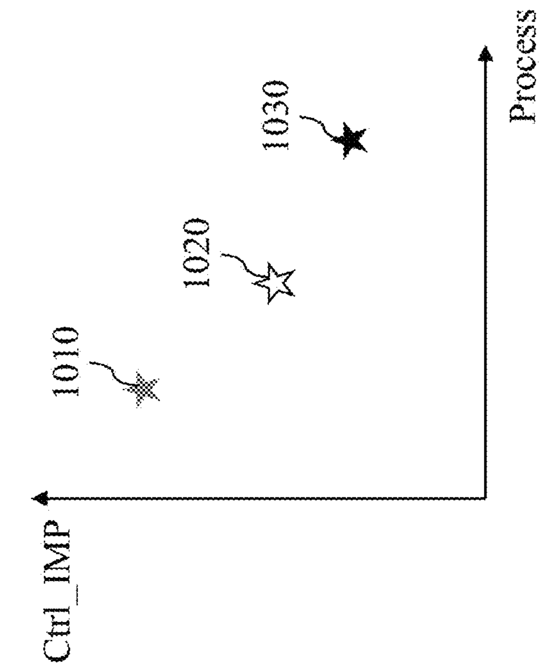
FIG. 10 shows a schematic diagram illustrating the value of control signal Ctrl_IMP at various process corners, in accordance with some embodiments of the present disclosure.

FIG. 10 shows a schematic diagram illustrating the value of control signal Ctrl_IMP at various process corners, in accordance with some embodiments of the present disclosure. As shown in FIG. 9, the clock signal $T_{OSC}$ has the longest period at the SS corner, so after time to digital conversion, the control signal Ctrl_IMP has the largest digital value at the SS corner, labeled as 1010. Furthermore, the clock signal $T_{OSC}$ has the shortest period at the FF corner, so after time to digital conversion, the control signal Ctrl_IMP has the smallest digital value at the FF corner, labeled as 1030. Furthermore, the digital value of the control signal Ctrl_IMP at the TT corner is labeled as 1020. As described above, the number of transistors coupled in parallel in each of the pull-up unit 210 and the pull-down unit 220 of FIG. 2 is determined according to the digital value of the control signal Ctrl_IMP. Therefore, the number of transistors coupled in parallel in each of the pull-up unit 210 and the pull-down unit 220 of FIG. 2 is greatest at the SS corner, followed by the TT corner, and least at the FF corner.

Figure 11:
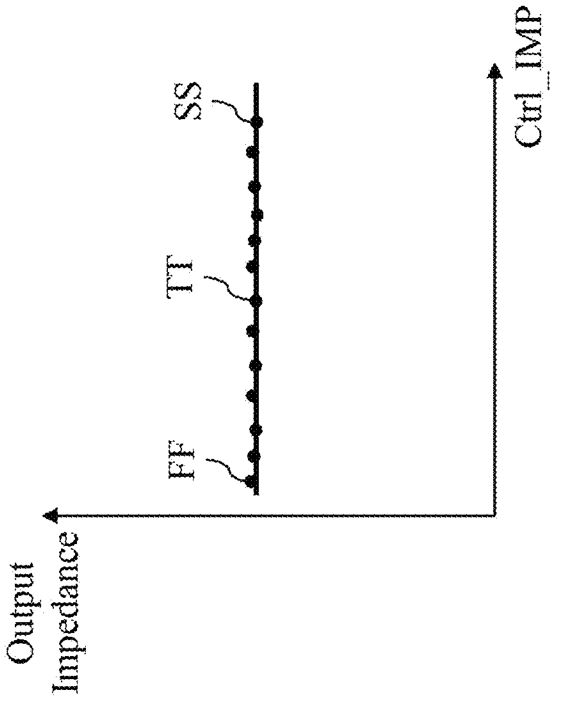
FIG. 11 shows a schematic diagram illustrating the output impedance of the transmitter at various process corners, in accordance with some embodiments of the present disclosure.

FIG. 11 shows a schematic diagram illustrating the output impedance of the transmitter at various process corners, in accordance with some embodiments of the present disclosure. The number of resistors coupled in parallel is different for different process corners, so as to maintain the output impedance of the pull-up unit 210 and the pull-down unit 220 in the transmitter 100 a constant resistance without using an external precision resistor. Using external precision resistor requires adding additional pad and electrostatic discharge (ESD) circuit within the IC, which increases the area and cost of the IC.

By performing the calibration operation according to the embodiments, the precise output impedance matching of the transmitter is implemented in the IC, thereby achieving very low reflection effects for high speed interface. Furthermore, no external precision resistor is used to calibrate the output impedance of transmitter, thereby cost (e.g., Bom and IC cost) is decreased. Moreover, in addition to initiating the calibration operation at startup of the IC, the calibration operation is performed dynamically to generate corresponding codes for the control signal Ctrl_IMP in response to PVT variations when the transmitter 100 is idle, such as when the pad 130 is in input mode, thereby making the output impedance more precise.

According to some embodiments, a transmitter is provided. The transmitter includes a driver coupled to a pad, a calibration circuit and a control circuit. The driver includes a pull-up unit having a plurality of first P-type transistors, a pull-down unit having a plurality of first N-type transistors. The calibration circuit includes a ring oscillator configured to provide a first clock signal, a frequency divider configured to divide the first clock signal to provide a second clock signal, and a time to digital converter configured to provide a control signal according to the second clock signal and a reference clock. The control circuit is configured to control the number of the first P-type transistors coupled in parallel between a power supply line and the pad, and the number of the first N-type transistors coupled in parallel between a ground and the pad according to the control signal.

According to some embodiments, an integrated circuit (IC) is provided. The IC includes a calibration circuit and a driver coupled to a pad. The calibration circuit includes a ring oscillator configured to provide a first clock signal, a frequency divider configured to divide the first clock signal to provide a second clock signal, a time to digital converter configured to provide a control signal according to the second clock signal and a reference clock. The driver includes a plurality of first transistors and a plurality of second transistors. The number of the first transistors coupled in parallel between a power supply line and the pad and the number of the second transistors coupled in parallel between a ground and the pad are dynamically controlled according to the control signal.

According to some embodiments, a method for calibrating an output impedance of a driver is provided. The method includes: generating a clock signal by a ring oscillator; dividing the clock signal by an integer value, wherein the integer value is a multiple of 2; converting a time interval of the divided clock signal to a digital code according to a reference clock; and controlling the number of transistors coupled in parallel in the driver coupled to a pad according to the digital code, so as to keep the output impedance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transmitter, comprising:

a driver coupled to a pad, and comprising:

a pull-up unit, comprising a plurality of first P-type transistors; and a pull-down unit, comprising a plurality of first N-type transistors;

a calibration circuit, comprising:

a ring oscillator configured to provide a first clock signal;

a frequency divider configured to divide the first clock signal to provide a second clock signal; and a time to digital converter configured to provide a control signal according to the second clock signal and a reference clock; and a control circuit configured to control the number of the first P-type transistors coupled in parallel between a power supply line and the pad, and the number of the first N-type transistors coupled in parallel between a ground and the pad according to the control signal.

2. The transmitter of claim 1, wherein the number of the first P-type transistors coupled in parallel is equal to the number of the first N-type transistors coupled in parallel.

3. The transmitter of claim 1, wherein the first P-type transistors have different sizes, and the largest size of the first P-type transistors is 2N times the smallest size of the first P-type transistors.

4. The transmitter of claim 3, wherein the first N-type transistors have different sizes, and the largest size of the first N-type transistors is 2N times the smallest size of the first N-type transistors.

5. The transmitter of claim 1, wherein the ring oscillator comprises a plurality of inverters connected in a ring, and the number of the inverters is odd.

6. The transmitter of claim 5, wherein each of the inverters comprises a second P-type transistor and a second N-type transistor, and the largest size of the first P-type transistors is twice a size of the second P-type transistor, and the largest size of the first N-type transistors is twice a size of the second N-type transistor.

7. The transmitter of claim 1, wherein the time to digital converter is configured to obtain a time interval of the second clock signal based on the reference clock, and convert the time interval into the control signal having a multi-bit binary code.

8. The transmitter of claim 1, wherein a frequency of the reference clock is greater than a frequency of the second clock signal.

9. The transmitter of claim 1, wherein an equivalent impedance between the power supply line and the pad through the first P-type transistors coupled in parallel is equal to an equivalent impedance between the ground and the pad through the first N-type transistors coupled in parallel.

10. An integrated circuit (IC), comprising:

a calibration circuit, comprising:

a ring oscillator configured to provide a first clock signal;

a frequency divider configured to divide the first clock signal to provide a second clock signal; and a time to digital converter configured to provide a control signal according to the second clock signal and a reference clock; and a driver coupled to a pad, and comprising:

a plurality of first transistors; and a plurality of second transistors, wherein the number of the first transistors coupled in parallel between a power supply line and the pad and the number of the second transistors coupled in parallel between a ground and the pad are dynamically controlled according to the control signal.

11. The IC of claim 10, wherein the first transistors have different sizes, and the second transistors have different sizes, wherein the largest size of the first transistors is 2N times the smallest size of the first transistors, and the largest size of the second transistors is 2N times the smallest size of the second transistors.

12. The IC of claim 10, wherein the ring oscillator comprises a plurality of inverters connected in a ring, and the number of the inverters is odd.

13. The IC of claim 12, wherein each of the inverters comprises a P-type transistor and an N-type transistor, and the largest size of the first transistors is twice a size of the P-type transistor, and the largest size of the second transistors is twice a size of the N-type transistor.

14. The IC of claim 10, wherein the time to digital converter is configured to obtain a time interval of the second clock signal based on the reference clock, and convert the time interval into the control signal having a multi-bit binary code.

15. The IC of claim 10, wherein a frequency of the reference clock is greater than a frequency of the second clock signal.

16. The IC of claim 10, wherein an equivalent impedance between the power supply line and the pad through the first transistors coupled in parallel is equal to an equivalent impedance between the ground and the pad through the second transistors coupled in parallel.

17. A method for calibrating an output impedance of a driver, comprising:

generating a clock signal by a ring oscillator;

dividing the clock signal by an integer value, wherein the integer value is a multiple of 2;

converting a time interval of the divided clock signal to a digital code according to a reference clock; and controlling the number of transistors coupled in parallel in the driver coupled to a pad according to the digital code, so as to keep the output impedance.

18. The method of claim 17, wherein the transistors have different sizes in the driver, and the largest size of the transistors is 2N times the smallest size of the transistors.

19. The method of claim 17, wherein a frequency of the reference clock is greater than a frequency of the divided clock signal.

20. The method of claim 17, wherein the ring oscillator comprises an odd number of inverters connected in a ring, wherein each of the inverters comprises a P-type transistor and an N-type transistor, and the largest size of the transistors is twice a size of the P-type or N-type transistor.

* * * * *